United States Patent
Lebedev

(10) Patent No.: US 6,741,200 B2
(45) Date of Patent: May 25, 2004

(54) METHOD AND APPARATUS OF STAGE AMPLIFIER OF ANALOG TO DIGITAL CONVERTER

(75) Inventor: Semyon Lebedev, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/218,041

(22) Filed: Aug. 14, 2002

(65) Prior Publication Data

US 2004/0032359 A1 Feb. 19, 2004

(51) Int. Cl.[7] .................................................. H03M 1/38
(52) U.S. Cl. ........................ 341/161; 341/156; 341/143
(58) Field of Search ................................. 341/161, 155, 341/143, 156, 165, 144, 118, 158, 136

(56) References Cited

U.S. PATENT DOCUMENTS

| | | | | |
|---|---|---|---|---|
| 4,588,993 A | * | 5/1986 | Babij et al. .................. 342/351 |
| 5,838,270 A | * | 11/1998 | Kiriaki ........................ 341/143 |
| 5,966,088 A | * | 10/1999 | Matsumoto et al. ........ 341/161 |
| 6,037,887 A | * | 3/2000 | Wu et al. .................... 341/143 |
| 6,049,310 A | * | 4/2000 | Sadahiro ..................... 343/860 |
| 6,111,531 A | * | 8/2000 | Farag ......................... 341/143 |
| 6,157,331 A | * | 12/2000 | Liu et al. .................... 341/143 |
| 6,278,750 B1 | * | 8/2001 | Yu .............................. 341/143 |
| 6,362,763 B1 | * | 3/2002 | Wang ......................... 341/143 |
| 6,563,445 B1 | * | 5/2003 | Sabouri ...................... 341/161 |

OTHER PUBLICATIONS

Andrew M. Abo and Paul R. Gray, "A 1.5V, 10-bit, 14.3-Ms/s CMOS Pipeline Analog-to-Digital Converter", IEEE Journal of Solid State Circuits, vol. 34, No. 5, May 1999, pp. 599-606.

* cited by examiner

Primary Examiner—Michael Tokar
Assistant Examiner—Lam T. Mai
(74) Attorney, Agent, or Firm—Eitan, Pearl, Latzer & Cohen Zedek, LLP

(57) ABSTRACT

Briefly, a stage amplifier comprises a differential amplifier having stages and a switch to connect a first differential output of a stage with a second differential output of the stage at a beginning of a conversion cycle.

20 Claims, 2 Drawing Sheets

METHOD AND APPARATUS OF STAGE AMPLIFIER OF ANALOG TO DIGITAL CONVERTER

BACKGROUND OF THE INVENTION

A pipeline analog to digital converter (ADC) architecture may include stage amplifiers. The number of stage amplifiers may be substantially equal to the number of output bits. The output bits may indicate the instantaneous amplitude level of an analog signal. The stage amplifier may receive an analog signal and according to a clock signal may compare the analog signal to a reference voltage level. The comparison result of the stage amplifier may be outputted in the form of an output voltage level that may be translated to values of logic bits. Furthermore, the stage amplifier may output one or two bits to provide a digital value to the sample of the analog signal. However, the output voltage of the stage amplifier may need to be adapted to a required output voltage level within a given range, e.g., a given error window. One solution of enabling the stage amplifier to adapt to the required output voltage level range within the given error window nay be to provide a large current to the stage amplifier. The large current may increase a slew rate and a bandwidth of the stage amplifier. A large charge current may increase a power consumption of the stage amplifier.

Thus, there is a need to provide a pipeline ADC which mitigates the above-described disadvantage.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
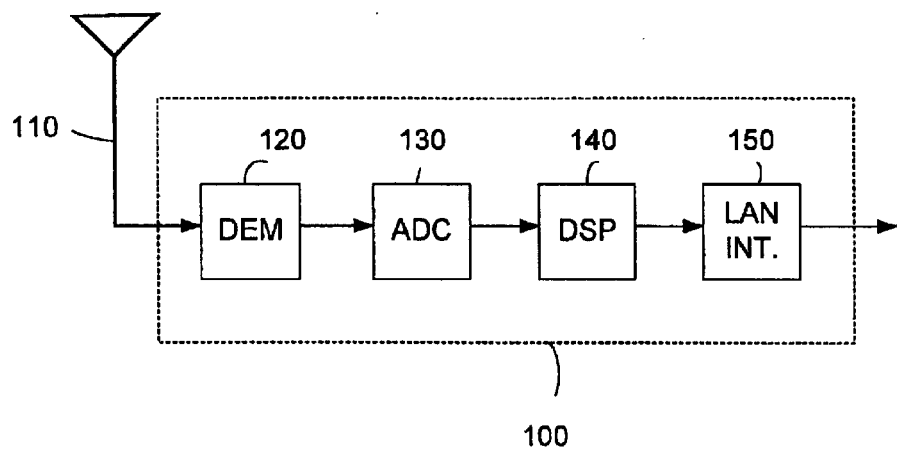
FIG. 1 is a block diagram of a receiver that includes an analog to digital converter (ADC), according to an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However it will be understood by those of ordinary skill in the art that the present invention may be practiced without these specific details. In other instances, well-known methods, procedures, components and circuits have not been described in detail so as not to obscure the present invention.

It should be understood that the present invention may be used in a variety of applications. Although the present invention is not limited in this respect, the circuits and techniques disclosed herein may be used in many apparatuses such as pipeline analog to digital converters (ADC). Although the present invention is not limited in this respect, pipeline ADC's may be used with receivers of a radio system. Receivers intended to be included within the scope of the present invention include, by a way of example only, wireless local area network (LAN) receivers, two-way radio receivers, digital system receivers, analog system receivers, cellular radiotelephone receivers and a like.

Types of wireless LAN receivers intended to be within the scope of the present invention include, but are not limited to, receivers for receiving spread spectrum signals such as, for example, Frequency Hopping Spread Spectrum (FHSS), Direct Sequence Spread Spectrum (DSSS) and the like.

For simplicity, although the scope of the invention is in no way limited in this respect, embodiments of the present invention that will be described below may be related to a pipeline ADC. The term "plurality" may be used throughout the specification to describe two or more components, devices, elements, parameters and the like. For example, "plurality of stage amplifiers" describes two or more stage amplifiers.

Referring firstly to FIG. 1, a block diagram of an apparatus that may be used with an exemplary embodiment of the present invention is shown. In this example, the apparatus is a receiver 100 and, more particularly, a receiver that may be used with a wireless LAN system and may comply with IEEE standard "IEEE Std 802.11-1997", if desired, although the scope of the present invention is in no way limited in this respect.

Although the scope of the present invention is not limited in this respect, the receiver 100 may include an antenna 110, a demodulator 120, a pipeline ADC 130, a digital signal processor (DSP) 140, and a LAN interface 150.

In operation, antenna 110, for example, a dipole antenna, a shot antenna, or the like, may receive modulated radio frequency (RF) signal that may include data Demodulator 120 may demodulate the RF signal and may provide an analog signal. Pipeline ADC 130 may receive the analog signal and may convert the analog signal into a digital signal. A detailed description of the operation of a pipeline ADC will be given with the description of FIG. 2 below. DSP 140 may receive the digital signal from pipeline ADC 130 and process the signal to provide LAN data to LAN interface 150. In this example, LAN interface 150 may be used to transmit the LAN data to a Personal Computer (PC), if desired.

Figure 2:
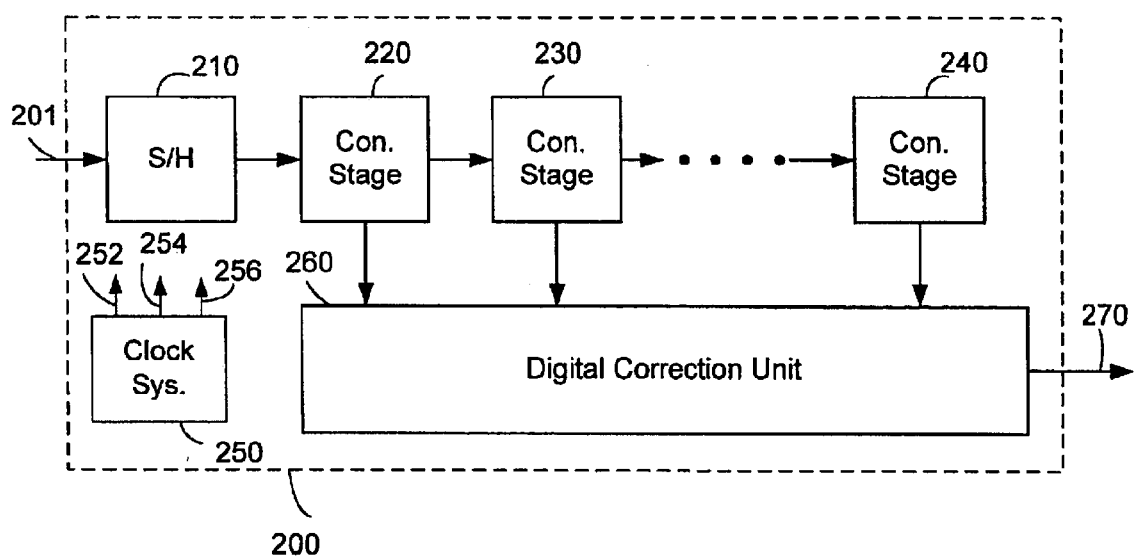
FIG. 2 is a block diagram of an ADC, according to an embodiment of the present invention.

Referring to FIG. 2 a pipeline ADC 200 according to an exemplary embodiment of the present invention is shown. Although the scope of the present invention is not limited in this respect, pipeline ADC 200 may include a sample and hold (S/H) unit 210, conversion stages 220, 230, 240, a clock system 250 and a digital correction unit 260.

In operation, pipeline ADC may convert an analog signal 201 to a digital signal 270. Clock system 250 may provide clock signals to S/H unit 210, conversion stages 220, 230 and 240, and digital correction unit 260. Although the scope of the present invention is not limited in this respect, clock system 250 may generate conversion cycles by providing clock signals during the conversion of analog signal 201 into digital signal 270. A conversion cycle may be controlled by a clock signal 252, a clock signal 254, and a clock signal 256. Although the scope of the present invention is not limited in this respect, a conversation cycle may include a sampling period controlled by clock signal 252 and a process-and-hold period controlled by clock signal 254. Furthermore, in an embodiment of the invention, for example, at the beginning of the sampling period, a reset period may be provided. The reset period may be controlled by clock signal 256. For example, during the sampling period, analog signal 201 may be sampled. During the process-and-hold period, the sample of the analog signal 201 may be held and processed by conversion stages 220, 230 and 240, and digital correction unit 260.

Conversion stages 220, 230 and 240 may provide at least one bit to digital correction unit 260. However, in this embodiment of the present invention, conversion stages 220, 230 and 240 may provide 1.5 bits to digital correction unit 260. Furthermore, in alternative embodiments of the present invention, conversion stages 220, 230 and 240 may provide two or more bits to digital correction unit 260, if desired, although the scope of the present invention is in no way limited in this respect. In addition, in this example of the present invention, conversion stages 220, 230 and 240 may have generally the same architecture. However, in alternative embodiments of the present invention, the architecture of some of the conversion stages may be different from the architecture of other stages. For example, in one embodiment of the present invention, one of the conversion stages, e.g. conversion stage 220, may include a differential stage amplifier and at least two comparators, and may provide 1.5–2 bits to digital correction unit 260.

Digital correction unit 260 may receive 2 bits from conversion stages 220, 230 and 240, may correct the value of the bits according to algorithms that may be known to one skilled in the art, and may provide a stream of bits that may represent an instantaneous amplitude level of analog signal 201. Although the scope of the present invention is not limited in this respect, the number of bits of digital signal 270 may be substantially equal to the number of conversion stages, if desired. Furthermore, in some embodiments of the present invention the number of bits may be less then the number of conversion stages, if desired. For example, a pipeline ADC that comprises ten conversion stages may output a 9 bits digital signal, if desired.

Figure 3:
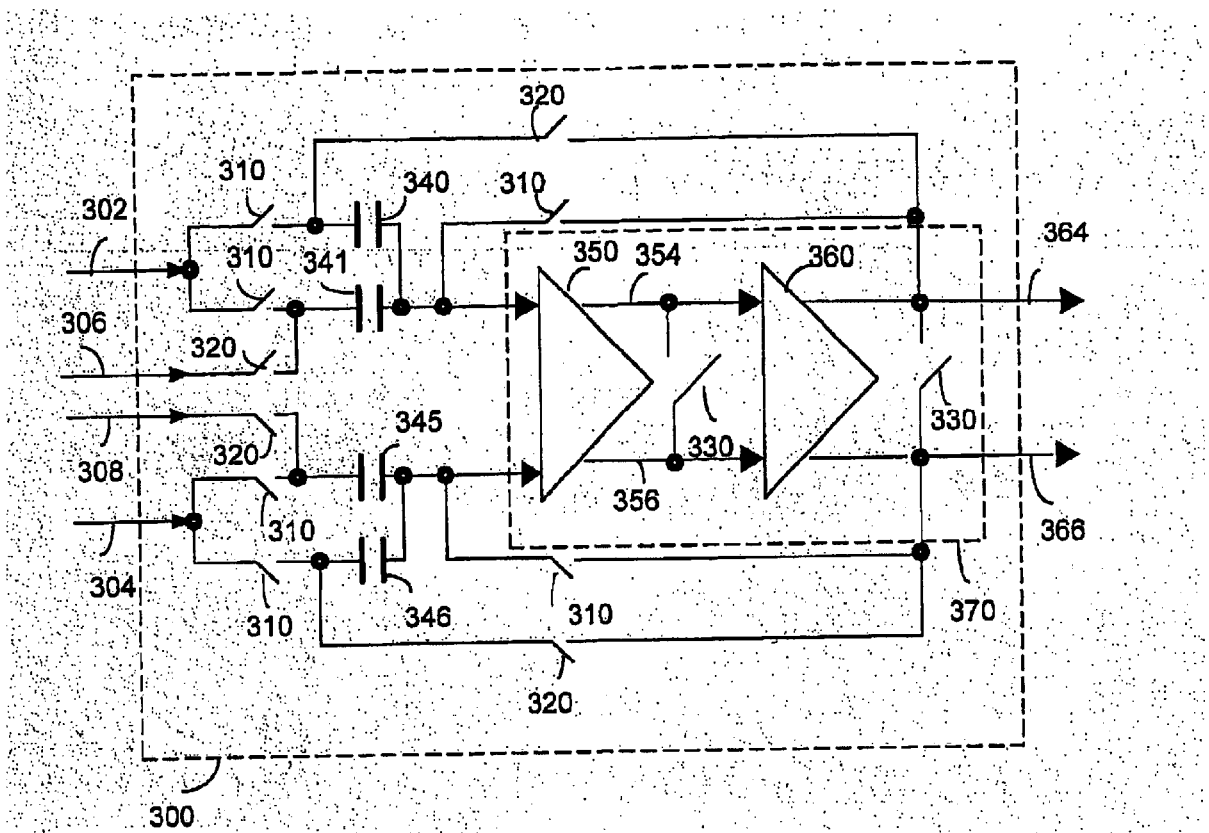
FIG. 3 is a block diagram of a stage amplifier, according to an embodiment of the present invention.
Figure 4:
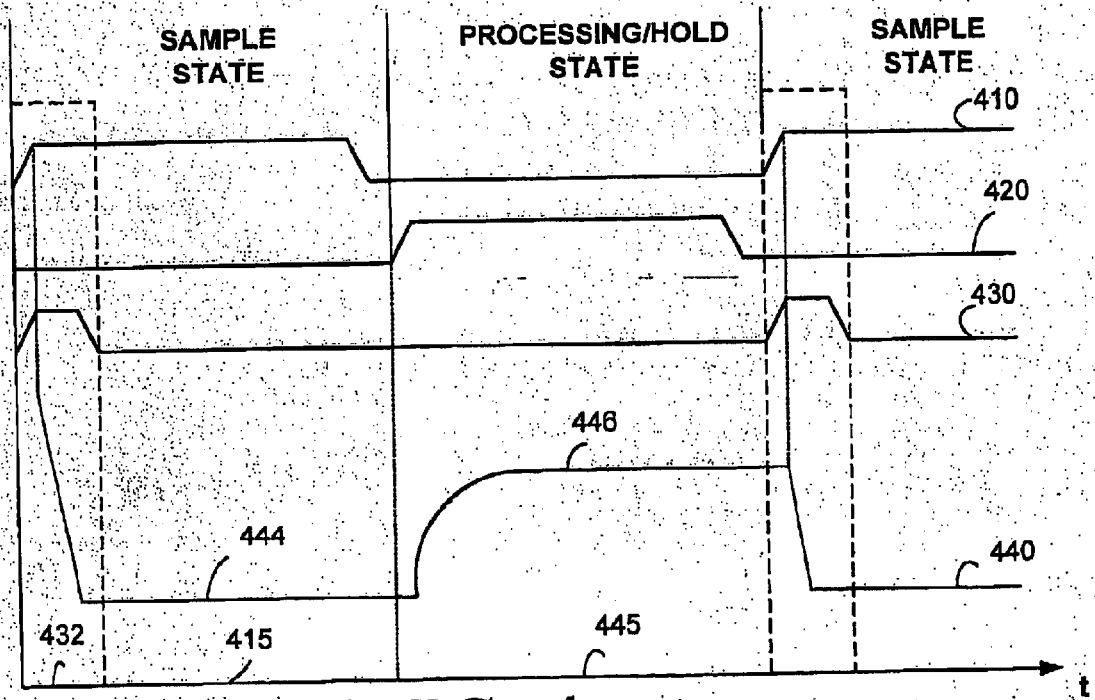
FIG. 4 is a schematic illustration of clock signal and output voltage diagrams helpful in understanding the operation of the stage amplifier of FIG. 3.

Turning to FIGS. 3 and 4, a detailed description will now be provided of the operation of a stage amplifier 300 that may perform the functionality of at least part of a conversion stage in accordance with exemplary embodiments of the invention. FIG. 3 is a schematic illustration of stage amplifier 300 according to an embodiment of the present invention, and FIG. 4 is a schematic illustration of timing and output voltage diagrams showing clock signals that may control conversion cycles of an input signal useful for the operation of stage amplifier 300.

Although the scope of the present invention is not limited in this respect, stage amplifier 300 may include a set of switches 310, a set of switches 320, a set of switches 330, capacitors 340, 341, 345 and 346, and a differential amplifier 370 that may include a first amplification stage 350 and a second amplification stage 360.

In operation, a conversion cycle may begin with a reset period 432. Although the scope of the present invention is not limited in this respect, during reset period 432 switches 330 may be closed. Thus, during reset period 432, differential outputs 354 and 356 of first amplification stage 350 of differential amplifier 370 may be connected to each other, and differential outputs 364 and 366 of second amplification stage 360 of differential amplifier 370 may also be connected to each other. Although the scope of the present invention is not limited in this respect, switches 330 may be controlled by a clock signal 430 (shown in FIG. 4). Switches 330 may be opened at the end of the reset period 432.

Concurrently, in an embodiment of the invention, switches 310 may be closed for a sampling period 415. Thus, capacitors 340 and 341 may be charged to a positive voltage level, which may be provided by input 302, and capacitors 345 and 346 may be charged to a negative voltage level, which may be provided by input 304. Furthermore, an output voltage level at outputs 364 and 366 may be substantial zero during sampling period 415, as indicated by level 444 of an output voltage diagram 440 shown with the timing and output voltage diagrams of FIG. 4. Although the scope of the present invention is not limited in this respect, the activation of switches 310 may be controlled based on a clock signal 410. However, it should be understood to one skilled in the art that clock signal 410 may include two clock cycles and/or a shorter clock cycle and/or a longer clock cycle, in comparison to the exemplary clock signal 410 described above with reference to in FIG. 4, or the like.

Although the scope of the present invention is not limited in this respect, at a process and hold period 445, switches 320 may be closed, and switches 310 may be opened. Furthermore, the operation of switches 320 may be controlled based on clock signal 420. However, it should be understood to one skilled in the art that clock signal 420 may include two clock cycles and/or shorter clock cycle and/or longer clock cycle, in comparison to the exemplary clock cycle 420 described with reference to FIG. 4, or the like. In addition, the output voltage level at outputs 364 and 366, during the process and hold period, may be relatively high, as indicated by level 446 of the output voltage diagram in FIG. 4. In addition, a positive reference voltage may be provided to capacitors 341 from an input 306, and a negative reference voltage may be provided from an input 308; however, it should be understood to one skilled in the art that a negative input voltage may be provided from input 306 and a positive voltage level may be provided from input 308. Furthermore, in some embodiments of the present invention, inputs 306 and 308 may be shorted by comparators (not shown). Although the scope of the present invention is not limited in this respect, the processing of the input signal may be performed by differential amplifier 370. For example, in the case of one to two conversion bits per stage, an output voltage of differential amplifier 370 may be calculated as follow Vout=2* Vin±Vref, wherein Vin may include differential input voltages 302 and 304, respectively, and Vref may include differential reference voltages 306 and 308, respectively.

Although the scope of the present invention is not limited in this respect, the next sampling period may begin with a reset period to reset the voltage at the outputs of first stage 350 and second stage 360 of differential amplifier 370. However, in alternative embodiments of the present invention, the reset period, during which the operation of connecting between the first differential output and the second differential output of the differential amplifier may be performed, may be at an end of the process and hold period of the conversion cycle. Furthermore, in other alternative embodiments of the present invention, the reset period may be performed at a time period between the beginning of the sampling period and the end of the process and hold period of the conversion cycle (not shown).

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true

What is claimed is:

1. An apparatus comprising:

a stage amplifier which comprises a differential amplifier having at least first and second amplification stages, a first switch to connect a first differential output of the first amplification stage with a second differential output of the first amplification stage, and a second switch to connect a first differential output of the second amplification stage with a second differential output of the second amplification stage, wherein the first and second switches are able to be closed for a predetermined time period at a beginning of a conversion cycle.

2. The apparatus of claim 1, further comprising:

a first set of switches to connect an analog signal to charge of capacitors during a sampling period of the conversion cycle; and a second set of switches to connect a reference voltage to the capacitors during a process and hold period of the conversion cycle.

3. The apparatus of claim 2, wherein the first set of switches is closed for a predetermined time at a beginning of the sampling period of the conversion cycle.

4. The apparatus of claim 1, further comprising:

a plurality of conversion stages connected in series to provide at least one bit to a digital correction unit.

5. The apparatus of claim 1 comprising a pipeline analog to digital converter.

6. An apparatus comprising:

a plurality of conversion stages to receive an analog input signal and to output a digital signal, wherein at least one conversion stage of the plurality of conversion stages comprises:

a stage amplifier comprising a differential amplifier having at least a first and second amplification stages, a first switch to connect a first differential output of the first amplification stage of the differential amplifier with a second differential output of said first amplification stage, and a second switch to connect a first differential output of the second amplification stage of the differential amplifier with a second differential output of said second amplification stage.

7. The apparatus of claim 6, further comprising:

a first set of switches to connect an analog signal to charge of capacitors during a sampling period of a conversion cycle; and a second set of switches to connect a reference voltage to the capacitors during a process and hold period of the conversion cycle.

8. The apparatus of claim 6, wherein the first and second switches are closed for a predetermined time at a beginning of the sampling period of the conversion cycle.

9. The apparatus of claim 6, further comprising:

a plurality of conversion stages connected in series to provide at least one bit to a digital correction unit.

10. The apparatus of claim 6 comprising a pipeline analog to digital converter.

11. An apparatus comprising:

a dipole antenna to receive a radio frequency signal;

a demodulator to receive the radio frequency signal from the antenna and to provide an analog signal; and a pipeline analog to digital converter to receive the analog signal and to provide a digital signal;

wherein a conversion stage of the pipeline analog to digital converter comprises a differential amplifier having at least first and second amplification stages, a first switch to connect a first differential output of the first amplification stage of the differential amplifier and a second differential output of the first amplification stage, and a second switch to connect a first differential output of the second amplification stage of the differential amplifier and a second differential output of the second amplification stage.

12. The apparatus of claim 11, further comprising:

a first set of switches to connect an analog signal to charge of capacitors during a sampling period of a conversion cycle; and a second set of switches to connect a reference voltage to the capacitors at a process and hold period of the conversion cycle.

13. The apparatus of claim 11, wherein the first and second switches are closed for a predetermined time period at a beginning of the sampling period of the conversion cycle.

14. The apparatus of claim 11, further comprising:

a plurality of conversion stages connected in series to provide at least one bit to a digital correction unit.

15. The apparatus of claim 11 comprising wireless local area network (LAN) receiver.

16. A method comprising:

connecting between a first differential output and a second differential output of a first amplification stage of a differential amplifier and between a first differential output and a second differential output of a second amplification stage of said differential amplifier for a predetermined time period during a cycle of converting an analog signal to a digital signal.

17. The method of claim 16, further comprising:

sampling an analog signal during a sampling period of the cycle; and processing the analog signal during a process and hold period of the cycle.

18. The method of claim 16, wherein connecting comprising:

connecting between the first differential output and the second differential output of at least one amplification stage of the differential amplifier during a beginning of the sampling period of the cycle.

19. The method of claim 17, wherein connecting comprising:

connecting between differential output and the second differential output of at least one amplification stage of the differential amplifier at an end of the process and hold period of the cycle.

20. The method of claim 17, wherein connecting comprising:

connecting between the first differential output and the second differential output of at least one amplification stage of the differential amplifier during a preset time period between the beginning of the sampling period and the end of the process and hold period of the conversation cycle.

* * * * *